United States Patent
Berry

(10) Patent No.: US 9,907,172 B2
(45) Date of Patent: Feb. 27, 2018

(54) DC LINK CAPACITOR BANK

(71) Applicant: Control Techniques Limited, Newtown (GB)

(72) Inventor: Stephen Berry, Newtown (GB)

(73) Assignee: NIDEC CONTROL TECHNIQUES LIMITED, Newtown (GB)

(*) Notice: Subject to any disclaimer, the term of this patent is extended or adjusted under 35 U.S.C. 154(b) by 836 days.

(21) Appl. No.: 14/033,776

(22) Filed: Sep. 23, 2013

(65) Prior Publication Data
US 2014/0085835 A1 Mar. 27, 2014

(30) Foreign Application Priority Data
Sep. 21, 2012 (GB) .................... 1216943.9

(51) Int. Cl.
H05K 1/16 (2006.01)
H05K 1/18 (2006.01)
H01G 2/16 (2006.01)
H01G 4/38 (2006.01)
H05K 1/02 (2006.01)

(52) U.S. Cl.
CPC ............... *H05K 1/18* (2013.01); *H01G 2/16* (2013.01); *H01G 4/38* (2013.01); *H05K 1/0293* (2013.01); *H05K 1/0263* (2013.01); *H05K 2201/10015* (2013.01); *H05K 2203/175* (2013.01)

(58) Field of Classification Search
CPC .. H01G 2/16; H01G 4/38; H01G 2/00; H01G 2/10; H01G 2/14; H05K 1/0293; H05K 1/18; H05K 1/0295; H05K 1/181; H05K 1/0263; H05K 2201/10015; H05K 2203/175
USPC ........ 174/260, 261, 262; 257/529, 528, 532; 361/522, 541, 748, 766
See application file for complete search history.

(56) References Cited

U.S. PATENT DOCUMENTS

| 4,219,856 A * | 8/1980 | Danfors | H02H 7/16 361/111 |
| 5,982,253 A * | 11/1999 | Perrin | B60N 2/448 333/182 |
| 5,994,170 A * | 11/1999 | Pedersen | H01L 23/5256 257/E21.511 |

FOREIGN PATENT DOCUMENTS

| CN | 201199631 | 2/2009 |
| CN | 202042885 | 11/2011 |
| CN | 202058591 | 11/2011 |
| GB | 812672 | 4/1959 |

* cited by examiner

*Primary Examiner* — Angel R Estrada
(74) *Attorney, Agent, or Firm* — Harness, Dickey & Pierce, P.L.C.

(57) ABSTRACT

A capacitor bank comprising at least two series chains each comprising a plurality of capacitors, wherein the series chains are coupled in parallel at corresponding points; and a fusible link arranged to form at least part of each coupling; wherein the corresponding points of each chain that are coupled to one another are at the same voltage when the capacitor bank is operational.

20 Claims, 7 Drawing Sheets

DC LINK CAPACITOR BANK

CROSS-REFERENCE TO RELATED APPLICATION

This application claims the benefit and priority of Great Britain Patent Application No. 1216943.9 filed Sep. 21, 2012. The entire disclosure of the above application is incorporated herein by reference.

FIELD

This invention relates to a capacitor bank in a DC link. It is particularly suitable for, but by no means limited to use in a DC link of an inverter, especially an inverter of a motor drive.

BACKGROUND

High voltage DC links are often used for coupling electrical circuits of differing voltage under a common DC level. Typically, the capacitors used are able to withstand high DC voltages, often with high-frequency ripple voltages as well as a wide temperature range of operation. In known systems, electrolytic capacitors are commonly used in a series-parallel configuration such as that shown in FIG. 1. Often, screw terminal capacitors in combination with bus bars are used to connect the capacitor terminals to the rails of the circuits of interest. These are cumbersome and labour intensive arrangements to assemble.

The manufacturing tolerance of capacitors operating in a capacitor bank is particularly important. The voltages across each capacitor in the bank will be different due to differing manufacturing tolerance. The time before failure of a capacitor is related to the voltage and current conditions that the capacitor is subjected during its lifetime as would be understood by the skilled person.

In such systems of FIG. 1, a short circuit failure in, for example, capacitor C4 (the failure shown as reference numeral 20 in FIG. 2), could cause both capacitor C1 and capacitor C3 also to fail owing to the increased voltage across those capacitors. Such an initial failure in C4 could be due to old age. For example, if the capacitor has been exposed to a higher current and voltage than neighbouring capacitors, then that capacitor's time before failure will most probably be shorter due to electrolyte degradation. The capacitor could fail short circuit as shown. Often, the busbar connection 10 can retain conductivity even in the face of serious failure in the capacitor bank. This can act to increase unwanted damage to circuitry, not only in the capacitor bank, but elsewhere in the system.

Other disadvantages of using screw terminal capacitors in combination with a busbar include:
1) Failure of one of the capacitors causes a large amount of damage. The busbars can be bent due to the force of the explosion associated with the failure and a flash-over (electric arc) can occur owing to the large amount of un-insulated busbar. This can lead to increased collateral damage and hence additional circuit malfunction.
2) A failure in one capacitor can cause more than one other capacitor to fail.
3) Inefficient use of space (large diameter round screw terminal capacitors take up a relatively large amount of space because of the voids between the capacitor cans).
4) Higher cost due to the need to design-in and manufacture multiple screw connections.

Therefore, a need arises for a more flexible, easier to manufacture, and less cumbersome arrangement for providing a DC link capacitor circuit where collateral damage in the case of a capacitor failure is limited.

SUMMARY

According to an aspect of the present invention there is provided a capacitor bank as defined in claim 1 of the appended claims. Thus there is provided a capacitor bank comprising at least two series chains of a plurality of capacitors. The series chains are coupled in parallel at corresponding points. A fusible link is arranged to form at least part of each coupling wherein the corresponding points of each chain that are coupled to one another are at the same voltage when the capacitor bank is operational.

With this arrangement, the damage caused by a short circuit failure in a capacitor is limited by way of the fusible link failing in an open circuit manner (breaking) and hence uncoupling the series links such that the failure is isolated.

Optionally, the corresponding points are positioned between capacitors of each chain, and further optionally, the corresponding points are positioned between each capacitor of each chain.

Each fusible link may be arranged to fail (preferably in an open circuit manner) when the current carried by that link is above a predetermined level, wherein the pre-determined level may include a steady-state or a nominal level.

Optionally, each coupling is formed by a fusible link which may comprise a weak link.

Optionally, each series chain comprises an equal number of capacitors.

The DC link capacitor bank may be coupled to a PCB, and further, may be positioned on or within a PCB. Optionally, the capacitors may comprise snap-in capacitors for positioning on a PCB.

Optionally, the fusible link may comprise a PCB conductive track.

The capacitor bank of any previous claim where the fusible link comprises a PCB conductive track. The PCB conductive track may comprise at least two sections, a narrower section and a wider section wherein the conductive track may comprise at least two narrower sections with wider sections adjacent the narrower sections.

The narrower sections of the PCB track may be arranged to fail in an open circuit manner when the current carried by the corresponding link is above a pre-determined level (or steady-state, nominal level).

The wider sections may provide heat sinking for the narrower sections. In this manner, the narrower (weaker) sections of track can operate in normal steady-state conditions to a pre-determined current level whilst also not over-heating during normal (non-failure mode) use. This avoids failures due to over-heating at normal current levels.

Optionally, the fusible link may comprise a fuse wire or a fuse.

Optionally, the fusible link may comprise a non-linear resistor, for example a resistor with a positive temperature coefficient.

The DC link may be arranged to span power rails of a plurality of circuits to be coupled to a common DC voltage level.

The capacitors of the DC link capacitor bank may each be of the same capacitance rating.

The DC link capacitor bank may be arranged within a motor drive.

With all the aspects of the invention, optional features are defined in the dependent claims.

The term snap-in capacitor refers to the way that the legs of the capacitor are bent so that when the capacitor is inserted into the PCB or other mounting board it snaps in place to prevent it from falling out before the PCB or other mounting board is soldered as would be understood by the skilled person.

BRIEF DESCRIPTION OF THE DRAWINGS

Embodiments will now be described, by way of example only, and with reference to the drawings in which.

In the figures, like elements are indicated by like reference numerals throughout.

DETAILED DESCRIPTION

Figure 1:
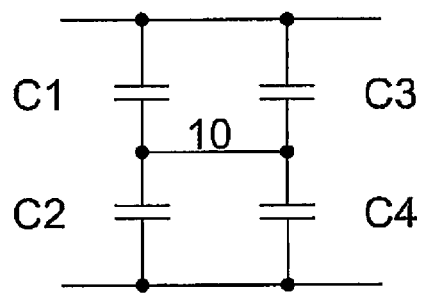
FIG. 1 illustrates a known arrangement of a DC link capacitor bank.
Figure 2:
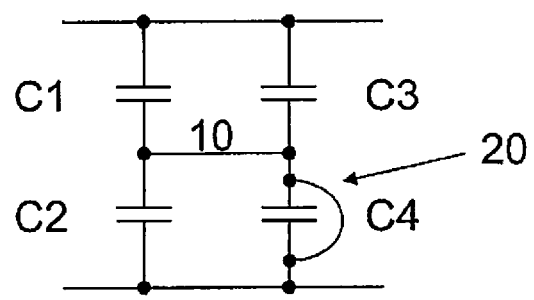
FIG. 2 illustrates a failure mode of the arrangement of FIG. 1.
Figure 3:
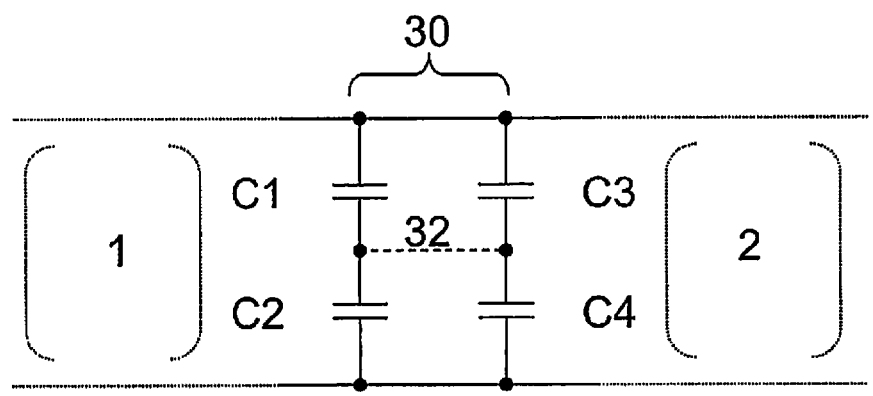
FIG. 3 illustrates an arrangement of a DC link capacitor bank according to an embodiment.

FIG. 3 shows an embodiment comprising two series chains of capacitors (C1+C2 and C3+C4) coupled in a parallel arrangement to form a capacitor bank 30. The capacitor bank may be arranged to couple together two circuits 1, 2 that may be operational at differing voltage levels. For example, the capacitor bank may be installed in a motor drive, uninterruptible power supply, or any other power electronic circuit comprising a DC link. Typically, capacitors forming a capacitor bank as shown in FIG. 3 are identical in size and rating. As shown in FIG. 3, link 32 is arranged to couple the two series chains at a point in between the capacitors of each chain. In the illustrated embodiment, the link is positioned at the centre point of each series chain. At the centre point of strings containing two capacitors as in FIG. 3, the voltage of each series chain is equal when the capacitor bank is operational. The link is positioned so that it couples points in chains where the voltage of those points are equal when operational.

Figure 6:
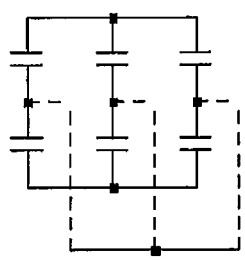
FIG. 6 illustrates another arrangement of a DC link capacitor bank according to an embodiment.
Figure 7:
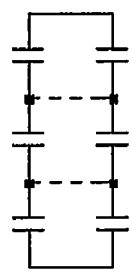
FIG. 7 illustrates another arrangement of a DC link capacitor bank according to an embodiment.
Figure 8:
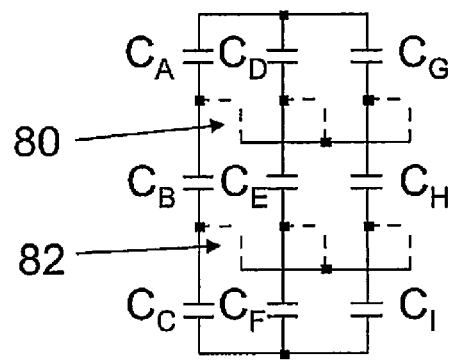
FIG. 8 illustrates another arrangement of a DC link capacitor bank according to an embodiment.

In other embodiments comprising more capacitors (see examples of FIGS. 6, 7 and 8), links may be positioned at points other than the centre point of a series chain. In FIGS. 6, 7 and 8, links 32 are denoted by a dashed and non-dashed line. As explained above, the points of the series chains that are coupled by a link have the same voltage when the bank is operational.

In other embodiments the arrangements of FIGS. 6, 7 and 8 may be extended to include any number of capacitors in series, and/or any number in parallel and hence there may be any number of links per chain. With the above arrangement, links may be placed at every point intermediate (in between) capacitors of adjacent series chains. In this manner, voltages are balanced within the capacitor bank. This avoids a link breaking during normal use due to the link having to carry extra current because of an uneven capacitor bank design (see FIG. 9).

Figure 9:
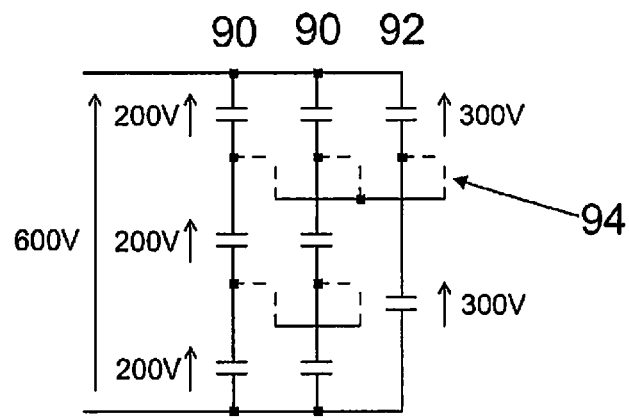
FIG. 9 illustrates an example of an unbalanced capacitor bank.

In the example of FIG. 9 comprising two strings (90) of three capacitors coupled in parallel with one string (92) of two capacitors, if there is 600V across the entire bank then capacitors 90 have 200V across each, and capacitors 92 have 300V across each. Link 94 would break due to the 100V difference causing increased current flow through that link. It is therefore preferential to arrange the capacitor bank so that each series chain comprises an equal number of capacitors each having the same rating.

In all embodiments, link 32 comprises a weak link such that collateral damage is limited in the event of a capacitor short-circuit failure. The width of link 32 depends on the pre-determined current that the link is to carry during normal operation as would be understood by the skilled person. This pre-determined level may include a steady-state or nominal level. The width of link 32 may further depend on factors such as operating temperature, PCB track thickness, allowable temperature rise, trace length etc as would also be understood by the skilled person.

Figure 4:
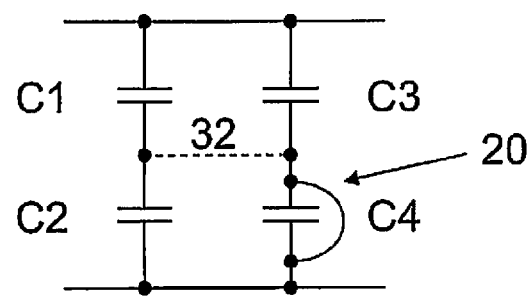
FIG. 4 illustrates a failure mode of the arrangement of FIG. 3.

As shown in FIG. 4, if capacitor C4 exhibited a short-circuit failure 20, capacitors C1 and C3 would be subjected to twice the voltage of normal operation across their terminals. Depending on the rating of capacitors C1 and C3, this increased voltage could, in turn, result in the failure of one of C1 and C3.

Figure 5:
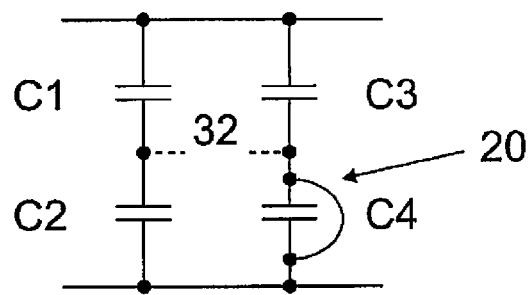
FIG. 5 illustrates the result of the failure mode of FIG. 4.

Upon a subsequent failure of C1, link 32 will break due to the sudden increased current therewithin (FIG. 5). This applies whether the subsequent failure is a short circuit or an open circuit as, typically, such failures both result in at least a temporary increase in current. Such an increase in current may be sufficient to break link 32 due to the increased current being above the rated a pre-determined level or steady-state (nominal) current level of link 32. Damage to other capacitors of the capacitor bank is hence avoided by isolating the result of the first short-circuit failure of C4.

As is clear, should a first short-circuit failure occur in C1, C2 or C4, the subsequent failure of a capacitor would result in the action of the weak link being transposed accordingly.

As a further example, in the embodiment of FIG. 8, a first short circuit failure in $C_G$ would result in increased voltage across $C_C$, $C_F$ and $C_I$. As a result, $C_C$ may fail short circuit. The links nearest $C_G$ and $C_E$ would now break. This limits damage to further capacitors.

As a further illustration, in the embodiment of FIG. 8, a first short circuit failure in $C_E$ would result in increased voltage across the top three ($C_A$, $C_D$, $C_G$) and bottom three ($C_C$, $C_F$, $C_I$) rows of capacitors as would be understood by the skilled person. This increased voltage, after a period, could result in the subsequent failure of one of those capacitors. Should $C_A$ fail open circuit for example, then there would be direct paths between $C_A$ and $C_E$ which would result in three times the normal voltage being across the bottom row of capacitors $C_C$, $C_F$, $C_I$. As a result, $C_C$ may fail. However, the fusible links 80 and 82 will break due to increased current flowing therethrough being above a predetermined (nominal or steady-state) level. As can be seen, with links 80 and 82 breaking (open circuit), the short circuit capacitors $C_A$, $C_C$ and $C_E$ are isolated from the rest of the capacitor bank.

In this example, $C_A$ $C_C$ and $C_E$ have failed short circuit, and the remaining working capacitors will have to contend with a higher voltage across them than they would normally be subjected to, however, it can be seen that simultaneous failure of multiple capacitors has been avoided by the use of fusible links.

A fuse or feature providing fuse-like properties may be placed for the capacitor bank as a whole to cater for a capacitor bank malfunction such as a short between the power rails or other fault which would not be isolated/mitigated by link(s) 32. This allows for the example of FIG. 12, where the action of the fusible links avoids simultaneous failure of multiple capacitors, however, a fuse or other device for the bank as a whole or for a larger system within which the bank is operating will be rendered open circuit to stop any further failure conditions and hence further damage.

Figure 12:
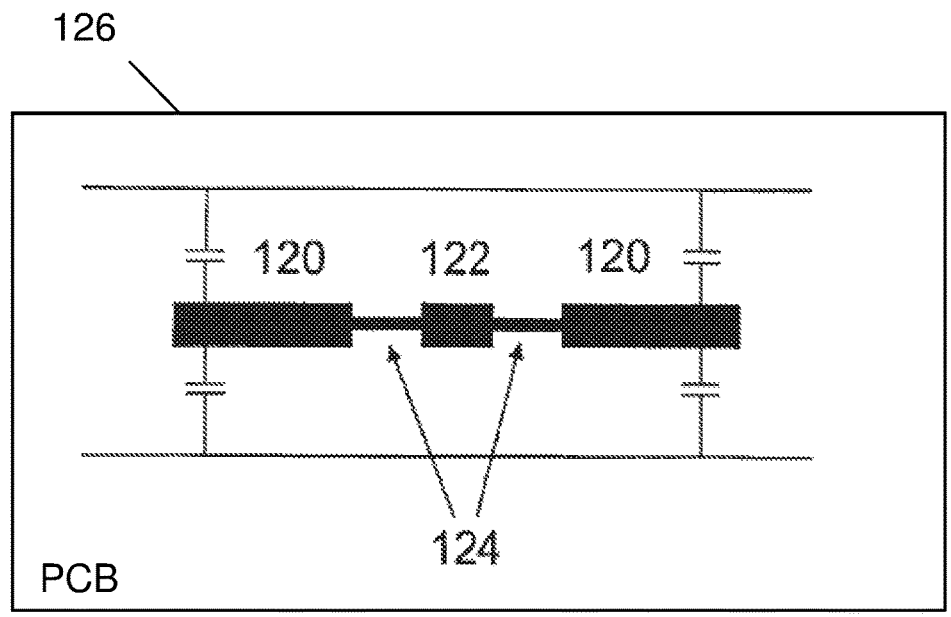
FIG. 12 illustrates a fusible link PCB trace positioned on an inner layer of a PCB according to an embodiment.

Link 32 may be a fusible link comprising a PCB track, for example a PCB track on an inner layer of a PCB. The PCB track may be positioned on a single inner layer of a PCB. For example, FIG. 12 illustrates a fusible link PCB trace positioned on an inner layer of a PCB 126 (e.g., within the PCB 126). Preferably, the link is positioned on an inner layer of a PCB comprising at least 4 layers as if the link (in the form of a PCB track) is on an inner layer, oxygen will be excluded from the link track should it melt which will prevent a large arc and so help to break the current quickly. The PCB is preferably made of a material such as FR4 or better.

As can be seen in FIGS. 6, 8, 10 and 11, the links 32 are illustrated as being partly dashed and partly non-dashed. The dashed sections denote the weak (typically thinner) sections of the link whereas the non-dashed sections are of a larger width.

PCB tracks of the fusible links are arranged such that the thinner (weak) section is placed in the proximity to a potential fault site such as a capacitor of the capacitor bank. This allows damage to be limited in the event of a failure.

In one embodiment illustrated in FIG. 12 which shows a capacitor bank arrangement of FIGS. 3 and 4, a fusible link comprises two sections of 5 mm long×10 thou track (124) on a PCB, for example a 1 oz PCB, with a block of 5 mm wide×5 mm long copper (122) in-between and further blocks of 5 mm wide copper (120) adjacent the thinner track. Other embodiments may include different widths and lengths of track with the weaker (fusible) sections comprising a width that is smaller than the sections that are not weak. For capacitor banks comprising a higher number of capacitors, the links would be arranged accordingly.

The dissipation of heat in the thinner parts of the link may be catered for by way of the wider PCB tracks compensating for the thinner (fusible) tracks. The wider track is placed in proximity to the weaker track (as shown in FIG. 12) to provide heat sinking for the thinner track so that the thinner track does not overheat and cause a failure when operating within a pre-determined level (or steady-state, nominal level).

Figure 13:
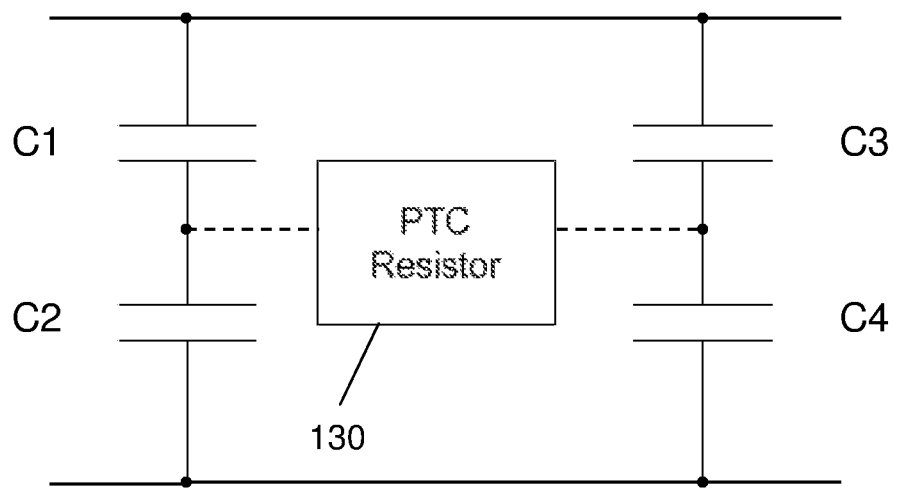
FIG. 13 illustrates an arrangement of a DC link capacitor bank including a positive temperature coefficient resistor according to an embodiment.

In other embodiments, link 32 may comprise a fuse wire or a fuse. Alternatively, link 32 may comprise a non-linear resistor such as a positive temperature coefficient resistor (e.g., a positive temperature coefficient (PTC) resistor 130 shown in FIG. 13). With increased current flowing through the resistor (link 32), the resistance of the link increases and, in effect, isolates the source of the fault from the rest of the capacitor bank by way of the increased resistance being so high that the link is effectively 'broken' as would be understood by the skilled person.

In further embodiments, the capacitor bank 30 comprising link (or links) 32 may be positioned on a daughter card, or other distinct circuit board so that, in the event of a failure of a capacitor and hence the breaking of a link 32 (as discussed herein), or other malfunction within the capacitor bank, the capacitor bank can be replaced with minimal burden. This allows the system within which the capacitor bank is operating to be brought back into operation as soon as possible.

Figure 11:
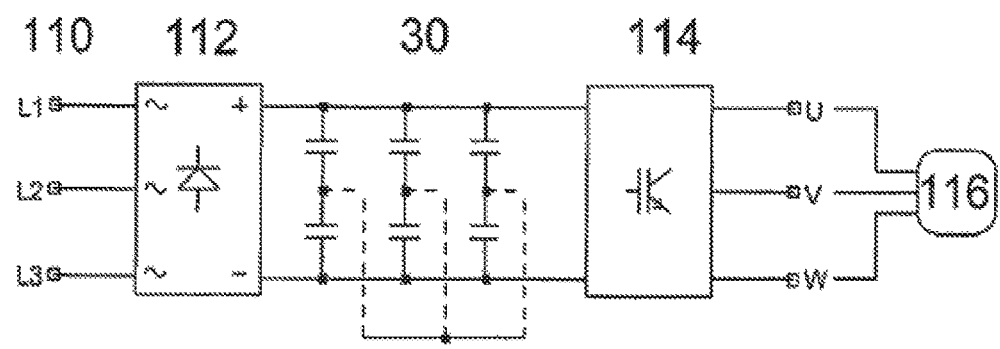
FIG. 11 illustrates a motor drive comprising a DC link capacitor bank according to an embodiment.

As shown in FIG. 11, a DC link capacitor bank 30 may be installed in a motor drive. The capacitor bank may comprise many more capacitors and links than those illustrated in FIG. 11. For example, there may be multiple rows and columns each containing many capacitors and links. In this embodiment, AC supply 110 is rectified to DC by rectifier 112. DC link 30 holds the input of inverter 114 at a common DC level. Inverter 114 produces the waveforms necessary to drive motor 116. DC link 30 provides smoothing as well as a common DC voltage between rectifier 112 and inverter 114. Should a failure occur within the capacitor bank, damage is limited to a minimal numbers of capacitors by way of the links 32 as described herein.

The system of FIG. 11 may comprise detection means arranged to detect a ripple voltage on the power rails caused by a malfunction within the capacitor bank. For increased safety, the system as a whole can shut down upon detecting such a ripple voltage to give additional protection over that provided by the DC-link capacitor bank comprising links 32. In this manner, as well as the capacitor bank reducing damage within itself, the system also shuts down for extra safety both for operating personnel and to minimise damage subsequent to a first fault in the capacitor bank.

The following benefits are realised by embodiments of capacitor banks disclosed herein:

Reduced overall Impedance—with an increased number of capacitors in a capacitor bank, the impedance is reduced as shown by the below examples:

| Cap value | 2200 uF | 780 uF |
|---|---|---|
|  | esr = 6.1 mΩ, | esr = 13 mΩ, |
|  | esl = 14 nH | esl = 20 nH |
| Configuration | 3 parallel chains of 2 capacitors in series | 8 parallel chains of 2 capacitors in series |
| Total value | 3300 uF | 3120 uF |
|  | esr = 4.1 mΩ, | esr = 3.3 mΩ, |
|  | esl = 9.3 nH | esl = 5 nH |

This allows less heat energy to be wasted.

Improved tolerance—owing to manufacturing tolerances, the number of relatively small sized capacitors in the bank would exhibit a spread of capacitance within their stated manufacturing limits. With an increased number of capacitors (which is achievable more readily and reliably by the use of embodiments described herein), the spread of actual as opposed to stated capacitance is more likely to be in the centre of the Gaussian distribution, i.e. the actual capacitance is more likely to follow expected capacitance, and hence the system as a whole will operate more predictably in relation to both electrical and environmental factors. This, in effect, mitigates manufacturing tolerances of the capacitors of the capacitor bank.

Reduced Cost—the choice of desired capacitance can be selected such that each capacitor can be made on a fully automated production line for placement on or within a PCB. At the time of filing this application, the largest C*V product for automatic production of capacitors is 780 μF 400V from the major manufacturer's. This benefit will naturally increase as manufacturing processes mature.

As discussed in the background section, known systems use screw terminal capacitors. With the above automated capacitor production, using a PCB allows snap-in capacitors that remove the necessity for screw fitment and the corresponding potential problem with installation. However, the approach of positioning a link as disclosed herein can be also used with standard axial and radial wire-ended capacitors, and is most suitable for use with high voltage electrolytic capacitors.

Improved Reliability—with the removal of screw terminals, the disadvantage of screws becoming loose and losing connection are negated. Depending on the arrangement of capacitor bank utilised, an increased total surface area provided by a larger number of smaller capacitors leads to improved cooling of the PCB where the capacitor bank is installed. Automated production of the capacitors used in the capacitor bank removes the need for manual handling which can introduce contaminants which degrade performance and reliability.

Figure 10:
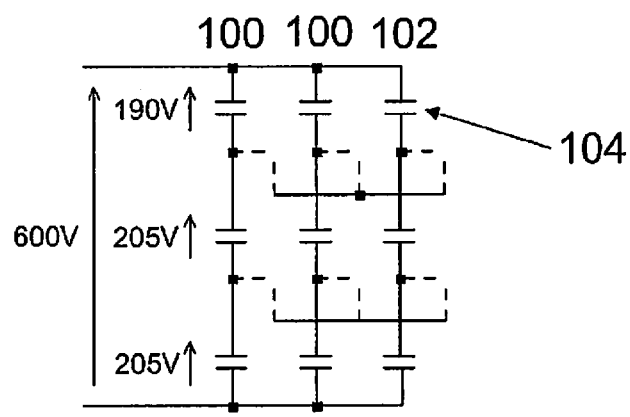
FIG. 10 illustrates an example of performance in the event of a degrading capacitor according to an embodiment.

Reliability is also improved. In the event of degradation of a capacitor of the capacitor bank, a reduced voltage may result across that capacitor (but not a complete failure). See FIG. 10 for an example of this scenario. With correctly functioning capacitors, in FIG. 10, all capacitors would have 200 v across their terminals. In this example, capacitor 104 has degraded to an extent that, due to leakage current, there would be only 120V across capacitor 104 if links 32 were not present. With the series chains (100, 102) of the capacitor bank coupled by links 32 to each corresponding point (normally of equal voltage during operation) on adjacent chains, the voltages are shared. This increases the voltage across the degraded capacitor above the voltage (120V) that would be present without links 32. The voltage is hence shared between the entire bank in a manner as shown in FIG. 10 whereby the top three capacitors have 190V across their terminals and the bottom 6 capacitors have 205V across their terminals. As can be seen, extremes of voltage that individual capacitors may be subjected to because of a degraded (but not failed) capacitor are not as great. By levelling out non-normal voltages in the case of degradation, the entire capacitor bank can operate for a longer time before any one capacitor fails due to old age which is brought on by exposure to non-optimal operating conditions.

Improved Safety—The aforementioned increase in reliability does not come at the expense of safety as the action of the links will mitigate failure in capacitors whilst also providing the above voltage sharing capability. Embodiments provide increased safety to personnel in close vicinity of the capacitor bank when operational. In known systems with a busbar, even after a capacitor malfunction has occurred, the busbar can continue to conduct which in turn, can prolong the malfunction condition. For example, other capacitors can also be damaged by way of abnormal circuit conditions being maintained after an initial failure. Where the capacitor bank comprises aluminium electrolytic capacitors, the electrolyte, if wet, can explode from the confines of the capacitor casing which could injure personnel or cause further damage to the system. Further, if the electrolyte is a solid electrolyte, the failure mode of a capacitor is more likely to be extreme which could result in fire. By utilising links 32, the embodiments described herein remove the failure condition from the circuit by way of isolation and damage limitation in the event of a capacitor malfunction of the capacitor bank. Before power is removed from the system, the system is placed in a more controlled condition where further faults and damage to both the system and any surrounding equipment are avoided. This also increases safety to personnel in the vicinity of the system.

Hence a capacitor bank is provided that enables improved safety, reliability, less dependency on manufacturer tolerances, less costly to manufacture.

The invention claimed is:
1. A capacitor bank comprising:
at least two series chains each comprising a plurality of capacitors, wherein the series chains are coupled in parallel at corresponding points on each series chain by a coupling extending from one series chain to another series chain and wherein the coupling is positioned between two capacitors of one series chain and two capacitors of another series chain; and
a fusible link arranged to form at least part of the coupling, wherein the corresponding points of each chain that are coupled to one another are at the same voltage when the capacitor bank is operational.
2. The capacitor bank of claim 1 wherein the corresponding points are positioned between capacitors of each chain.
3. The capacitor bank of claim 1 wherein the corresponding points are positioned between each capacitor of each chain.
4. The capacitor bank of claim 1 wherein each series chain comprises an equal number of capacitors.
5. The capacitor bank of claim 1 wherein the bank is coupled to a PCB.
6. The capacitor bank of claim 5 wherein the bank is positioned on or within the PCB.
7. The capacitor bank of claim 5 wherein the capacitors are configured to snap-in place when positioned on the PCB.
8. The capacitor bank of claim 1 where the fusible link comprises a PCB conductive track.
9. The capacitor bank of claim 8 wherein the PCB conductive track comprises at least two sections, one section wider than the other.
10. The capacitor bank of claim 8 wherein the PCB conductive track comprises at least two narrower sections with wider sections adjacent the narrower sections.
11. The capacitor bank of claim 9 wherein at least one wider section is arranged to provide heat sinking for at least one narrower section.
12. The capacitor bank of claim 1 wherein the bank is arranged to span power rails of a plurality of circuits to be coupled to a common DC voltage level.
13. The capacitor bank of claim 1 wherein the capacitors are each of the same capacitance rating.
14. The capacitor bank of claim 1 wherein the bank is positioned within a motor drive.
15. The capacitor bank of claim 1 wherein the bank is positioned within an uninterruptible power supply.
16. The capacitor bank of claim 1 wherein the capacitor bank is positioned on a daughter card.
17. The capacitor bank of claim 1 wherein each fusible link is arranged to fail in an open circuit manner when the current carried by that link is above a pre-determined level.
18. The capacitor bank of claim 9 wherein a narrower section of the PCB track is arranged to fail in an open circuit manner when the current carried by the corresponding link is above a pre-determined level.
19. The capacitor bank of claim 1 wherein the fusible link comprises a non-linear resistor.

20. The capacitor bank of claim 19 wherein the non-linear resistor comprises a positive temperature coefficient resistor.

\* \* \* \* \*